United States Patent
Raynor

(10) Patent No.: US 6,884,985 B2
(45) Date of Patent: Apr. 26, 2005

(54) SOLID STATE IMAGE SENSORS AND MICROLENS ARRAYS

(75) Inventor: Jeff Raynor, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 306 days.

(21) Appl. No.: 10/008,606

(22) Filed: Dec. 6, 2001

(65) Prior Publication Data

US 2002/0079491 A1 Jun. 27, 2002

(30) Foreign Application Priority Data

Dec. 8, 2000 (GB) .............................................. 0029947

(51) Int. Cl.[7] .............................................. H01L 27/00
(52) U.S. Cl. .................................. 250/208.11; 348/275
(58) Field of Search ............................ 250/208.1, 216; 348/275; 359/619, 621, 626

(56) References Cited

U.S. PATENT DOCUMENTS

| | | | | |
|---|---|---|---|---|
| 4,861,140 A | 8/1989 | Lucitte et al. | ............... | 350/320 |
| 5,250,798 A | 10/1993 | Iizuka et al. | ............... | 250/208.1 |
| 5,610,390 A | 3/1997 | Miyano | ..................... | 250/216 |
| 5,614,590 A | 3/1997 | Bederke et al. | .............. | 525/127 |
| 5,677,200 A | 10/1997 | Park et al. | ...................... | 437/3 |
| 5,682,203 A * | 10/1997 | Kato | ........................... | 348/340 |
| 5,986,704 A | 11/1999 | Asai et al. | .................. | 348/340 |
| 6,137,535 A * | 10/2000 | Meyers | ...................... | 348/340 |
| 6,212,011 B1 * | 4/2001 | Lissotschenko et al. | .... | 359/623 |
| 6,373,633 B1 * | 4/2002 | Brown | ....................... | 359/618 |

FOREIGN PATENT DOCUMENTS

| | | | | |
|---|---|---|---|---|
| FR | 2708147 | 1/1995 | ......... | H01L/27/148 |
| JP | 8-116041 | 5/1996 | ........... | H01L/27/14 |
| JP | 9-116127 | 5/1997 | ........... | H01L/27/14 |

OTHER PUBLICATIONS

Itakura et al., *A 1–mm 50 k–Pixel CCD Image Sensor for Miniature Camera System*, IEEE Transactions on Electron Devices, vol. 47, No. 1, Jan. 2000, pp. 65–69.

* cited by examiner

Primary Examiner—Stephone B. Allen
(74) Attorney, Agent, or Firm—Lisa K. Jorgenson; Allen, Dyer, Doppelt, Milbrath & Gilchrist, P.A.

(57) ABSTRACT

A solid state image sensor includes an array of pixels and a corresponding array of microlenses. The positions of the microlenses relative to their corresponding pixels may vary according to the distances of the pixels from a central optical axis of the image sensor to substantially eliminate vignetting of light collected by the microlenses.

18 Claims, 7 Drawing Sheets

4x4 REGULAR BLOCK    4x4 BLOCK WITH
                     ONE SHIFTED MICROLENS

SOLID STATE IMAGE SENSORS AND MICROLENS ARRAYS

FIELD OF THE INVENTION

The present invention relates to solid state image sensors of the type including an array of light sensitive elements (i.e., pixels) and, more particularly, to solid state image sensors including an array of microlenses disposed in front of the pixel array.

BACKGROUND OF THE INVENTION

A conventional solid state image sensor includes an array of light sensitive pixels. Not all of the area of each pixel is light sensitive. In a complementary metal-oxide semiconductor (CMOS) type image sensor, typically about 50% of the area of each pixel is occupied by opaque, non-sensitive circuitry. Light impinging on the non-sensitive pixel area is not collected, resulting in a loss of sensitivity and degraded performance. This is illustrated schematically in FIG. 1, which shows two adjacent pixels of a sensor array each including a sensitive area 200 surrounded by non-sensitive circuitry 202. Light 204 which strikes the sensitive areas 200 contributes to the sensor output signal. Light 206 which strikes the non-sensitive circuitry 202 is scattered and lost (i.e., not detected).

Such loss of sensitivity can be compensated for by the use of microlenses. As illustrated in FIG. 2, a microlens 208 is associated with each pixel. The microlens 208 covers both the sensitive and non-sensitive areas 200 and 202 of the pixel, collecting light from most of the total pixel area and focussing the collected light onto the sensitive area 200 of the pixel. Accordingly, a greater proportion of the light striking the pixel area is collected and, thus, the sensitivity of each pixel is improved. Typically, the use of microlenses approximately doubles the sensitivity of an equivalent sensor without microlenses. This technique is well known in the art as may be seen, for example, in U.S. Pat. Nos. 4,861,140; 5,677,200; 5,250,798; and 5,614,590.

The arrangement shown in FIG. 2 is a simplification, showing only light rays which are perpendicular to the sensor surface so that the microlenses focus the light rays onto the center of the sensitive area 200 of each pixel. This is true at the optical axis of the image sensor but, for pixels located off-axis, the light rays are non-perpendicular to the sensor surface, as shown in FIG. 3.

Here, because the light rays are non-perpendicular, the area onto which the light rays are focussed is shifted away from the center of the sensitive area 200, but is still entirely within the sensitive area. The size of the shift is dependent on the curvature and refractive index (i.e., the focal length) of the microlens 208, the distance between the microlens and the sensor surface, the primary optics of the imaging system of which the sensor forms a part, and the distance of the pixel from the optical axis.

As long as the light collected by the microlens 208 is focussed entirely within the sensitive area 200 of the pixel, the shift of the focussing spot is not significant. However, if the shift is so extreme that the focussing spot is shifted partly or wholly out of the sensitive pixel area 200, as shown in FIG. 4, the pixel will fail to detect some or all of the light, resulting in a loss of sensitivity known as "vignetting." This is particularly problematic with CMOS type image sensors which include a greater number of metal layers than, for example, CCD devices. As a result, there is a larger distance between the microlens and the sensor surface, and this increases the shift of the focussing spot.

One attempt to address this problem is to increase the exit pupil of the primary lens system, but this is expensive and not cost effective for CMOS sensors which are generally used in low-cost imaging systems. Another attempt to address the problem of vignetting is disclosed in U.S. Pat. No. 5,610,390, in which the position of the microlens relative to the pixel is adjusted by an amount which varies with the distance of the pixel from the optical axis of the sensor array. This is illustrated in FIG. 5, where the microlenses are shifted to the left by a distance d, as compared with FIG. 4, so that the focussing spots are shifted back into the sensitive areas 200 of the pixels. According to U.S. Pat. No. 5,610,390, the optical axis of each microlens is displaced towards the central axis of the sensor array by an amount which is proportional to the distance between the pixel and the central axis.

In theory, for a given sensor, microlens array and primary lens system, the spacing between adjacent microlenses may be adjusted, and hence their positions varied relative to the pixel array, such that all of the light collected by each microlens is focussed on the center of the associated pixel. However, this solution would require different microlens arrays to suit the parameters of specific imaging systems. Also, the relative microlens shifts required for adjacent pixels are so small that it is impractical to apply the necessary displacements to individual microlenses in the manner disclosed in U.S. Pat. No. 5,610,390.

SUMMARY OF THE INVENTION

It is an object of the present invention to provide an improved image sensor having a microlens array which reduces vignetting while mitigating the aforesaid disadvantages of the prior art.

This and other objects, features, and advantages are provided by a solid state image sensor which may include an array of pixels and a corresponding array of microlenses disposed in front of the array of pixels. The positions of the microlenses relative to their corresponding pixels may vary according to the distances of the pixels from a central optical axis of the image sensor to substantially eliminate vignetting of light collected by the microlenses. Further, the array of microlenses may be divided into blocks, each of the blocks may include a plurality of microlenses. Also, within a particular block of microlenses, the positions of the microlenses relative to their corresponding pixels may be varied by an equal amount.

The microlenses within each of the blocks may be substantially equally spaced apart by a first distance, and adjacent blocks of microlenses may be spaced apart by a second distance which is less than the first distance. Additionally, the microlenses may be substantially equally spaced throughout the array of microlenses, and selected microlenses at the edges of the blocks may be smaller in at least one direction than the remainder of the microlenses of the blocks. More particularly, the blocks may be substantially rectangular. The blocks may also have irregular edges configured such that the blocks are tessellated to form a substantially continuous array of microlenses.

A solid state image sensor according to the invention may include an array of pixels having a first aspect ratio, and each of the pixels may include a light-sensitive area having a second aspect ratio. Moreover, the first aspect ratio may be substantially equal to the second aspect ratio.

Yet another aspect of the invention is for an imaging system which may include a solid state image sensor as briefly described above. Additionally, a camera is also provided according to the invention and may again include a solid state image sensor as briefly described above.

BRIEF DESCRIPTION OF THE DRAWINGS

Embodiments of the invention will now be described, by way of example only, with reference to the accompanying drawings, in which.

DETAILED DESCRIPTION OF THE PREFERRED EMBODIMENTS

Figure 1:
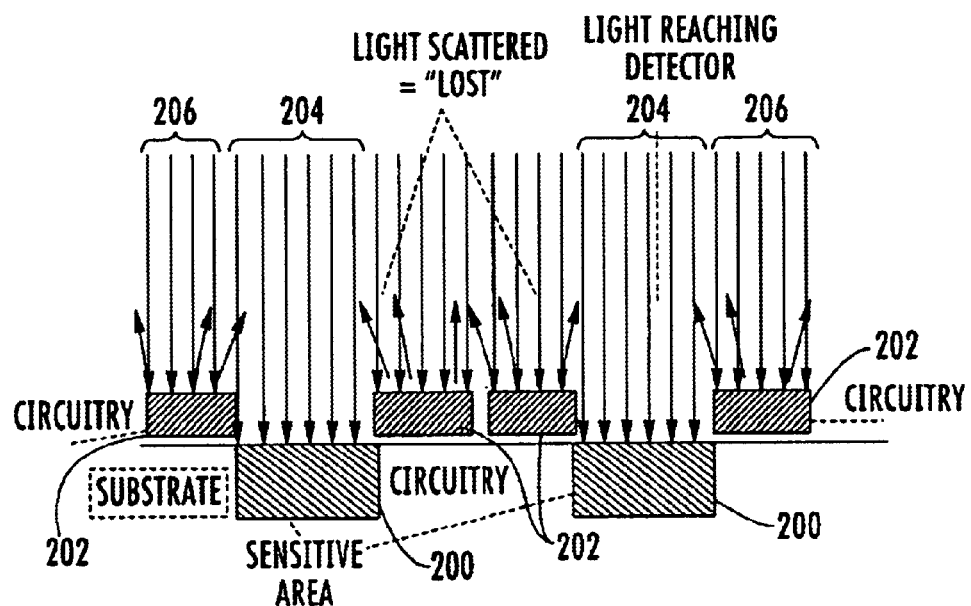
FIG. 1 is a cross sectional view of a pixel array of a prior art solid state image sensor.
Figure 2:
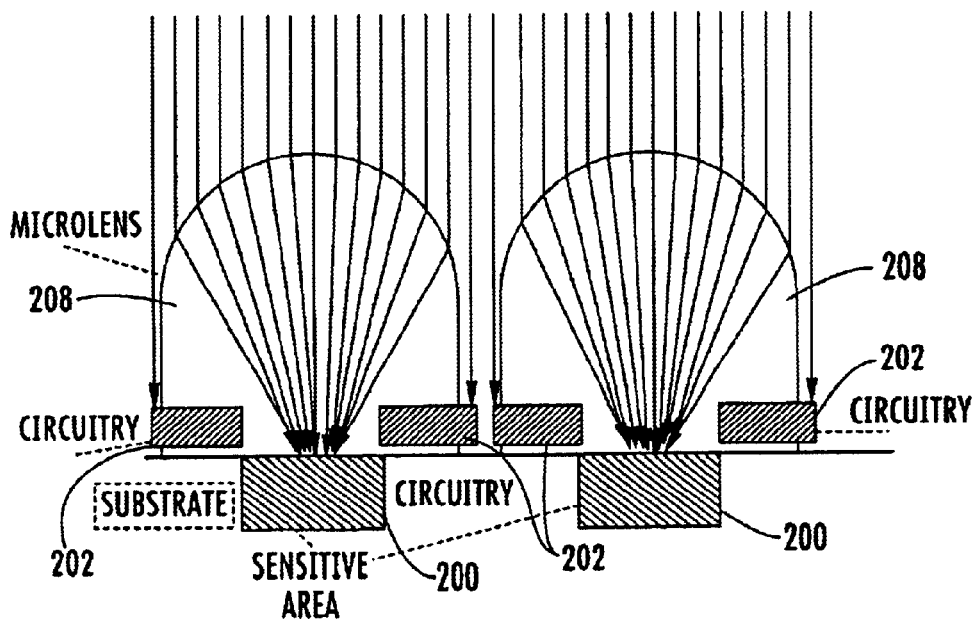
FIG. 2 is a cross sectional view of a microlens array applied to the pixel array of FIG. 1.
Figure 3:
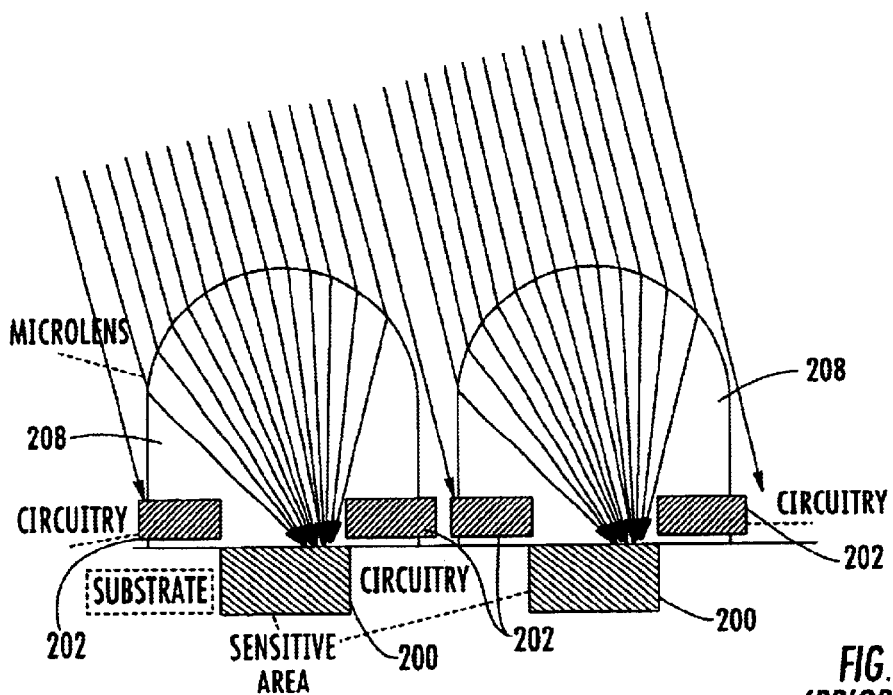
FIG. 3 is a cross sectional view illustrating off-axis illumination of the pixel array of FIG. 2.
Figure 4:
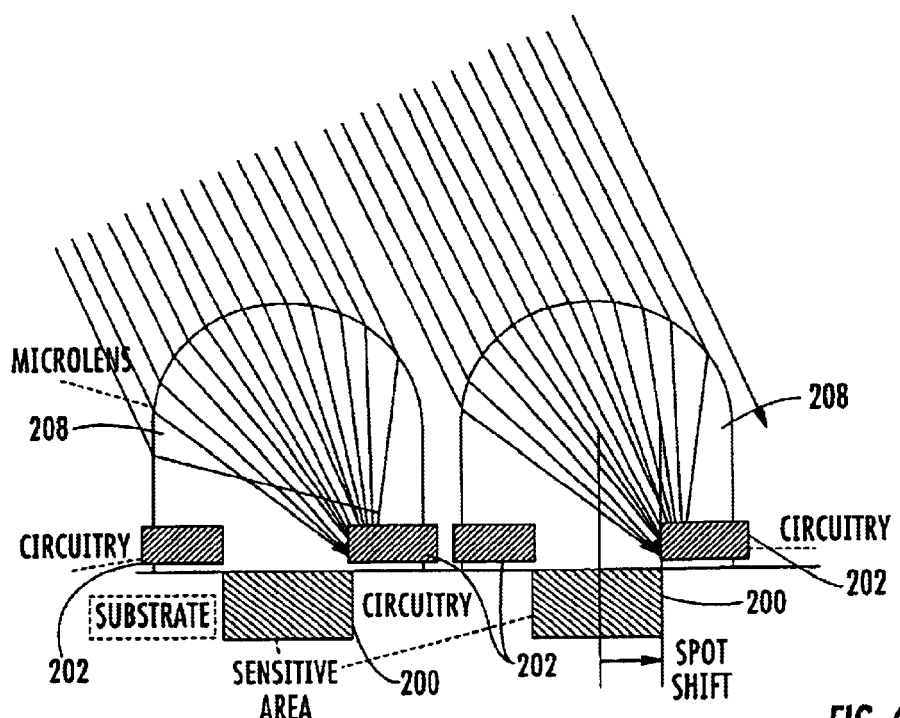
FIG. 4 is a cross sectional view illustrating extreme off-axis illumination of the pixel array of FIG. 2, resulting in vignetting.
Figure 5:
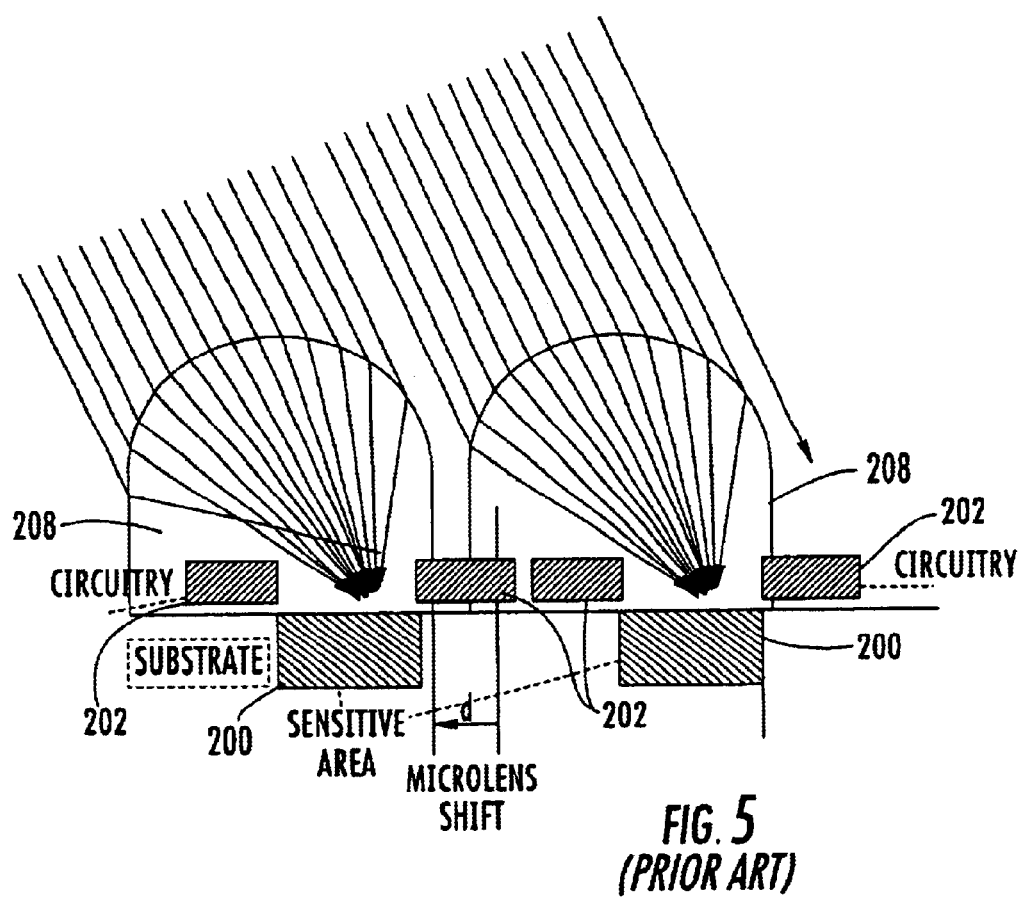
FIG. 5 is a cross sectional view illustrating the displacement of microlenses relative to associated pixels to compensate for off-axis illumination according to the prior art.
Figure 6:
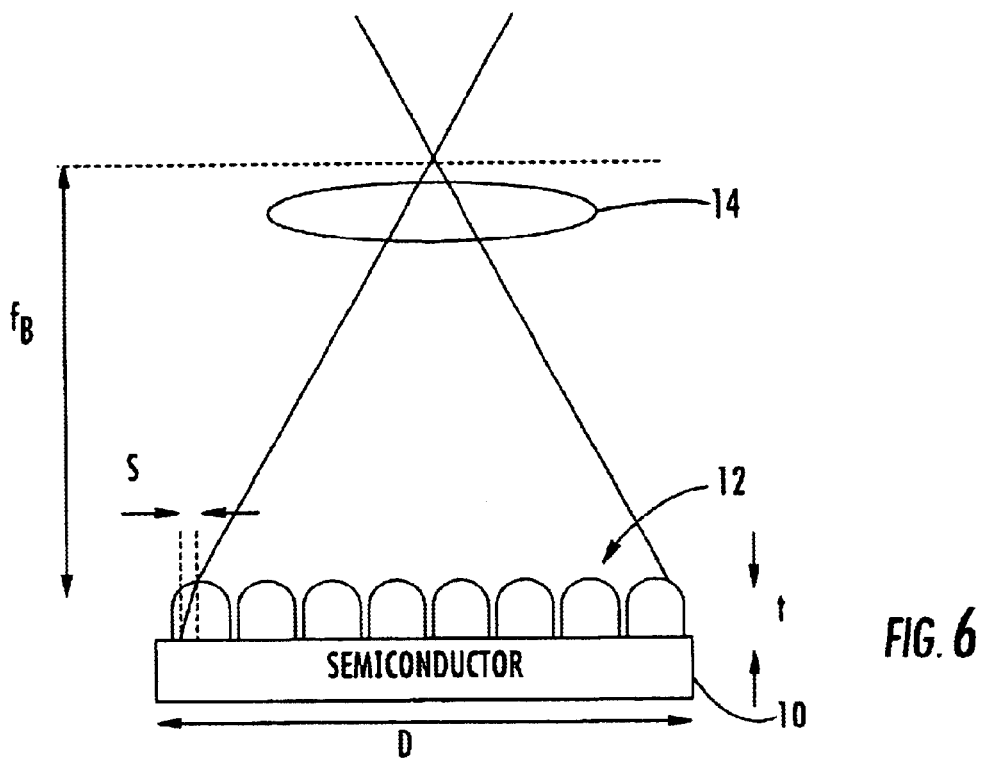
FIG. 6 is a schematic block diagram of the geometry of an image sensor with a microlens array and a primary lens according to the present invention.

Referring now to FIG. 6, an imaging system according to the present invention includes a solid state image sensor 10 having a length/width D, a microlens array 12 having a thickness t and a refractive index n, and primary lens system 14 having a focal length $f_B$. For a pixel at the edge of the sensor 10, the focussing spot is shifted away from the center of the sensor as a result of off-axis illumination by an amount s, where:

$$s = D \times t/(2 \times f_b \times n). \tag{1}$$

The corresponding microlens would have to be shifted by the same amount in the opposite direction to compensate for this. Equation (1) is simplified for a one-dimensional (linear) sensor array, but is easily extended to two dimensions for a rectangular sensor array.

Figure 7:
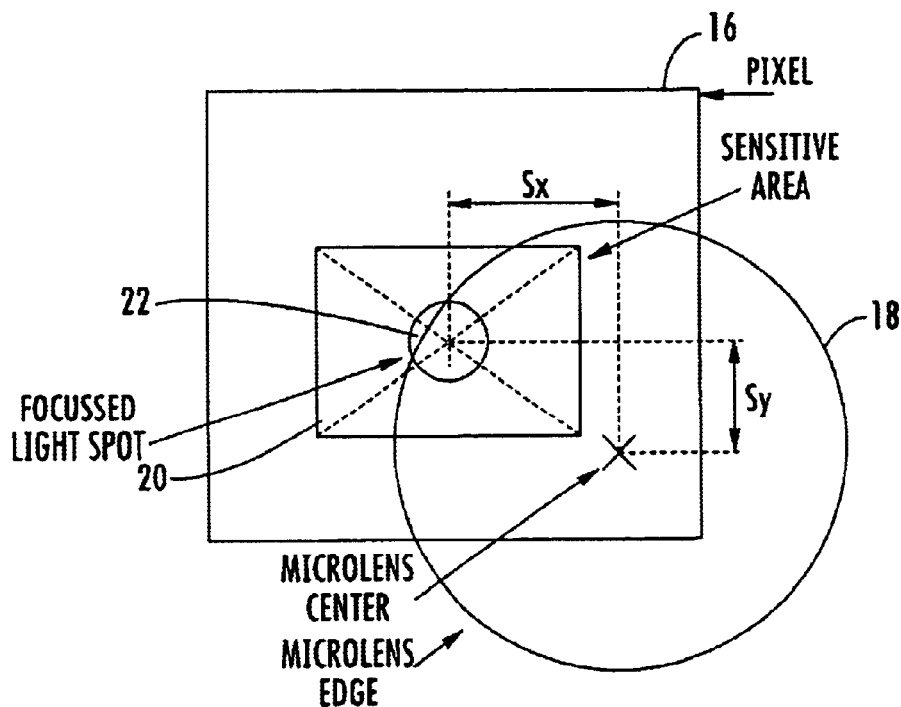
FIGS. 7 and 8 are schematic block diagrams illustrating individual pixels and displacements of microlenses and focussed light spots relative thereto according to the present invention.

It will be understood that the present analysis is applicable to a range of types of primary lens systems including single- and multi-element lenses. Turning now to FIG. 7, the corresponding situation for a pixel 16 and microlens 18 located at the top left hand corner of a two-dimensional sensor array is illustrated. The microlens 18 is shifted towards the center of the array in both the x and y directions, the x and y components $s_x$ and $s_y$ each being calculated using equation (1) and $D_x$ and $D_y$ as the x and y dimensions of the array. The shift of the microlens 18 relative to the pixel 16 results in the focussed light spot 22 falling in the center of the sensitive area 20.

Equation (1) depends on the focal length of a specific primary lens system. This is disadvantageous since the modified microlens array is matched to a particular primary focal length, restricting the range of different lenses that will work with the sensor without vignetting. It is desirable for a single sensor design to work with as large a range of primary lenses as possible. In order to maximize the range of possible primary lenses, it is important to note that the focussed light spot 22 does not need to fall in the center of the sensitive area 20 to avoid vignetting. It is only necessary that substantially all of the focussed light falls somewhere within the sensitive area.

Figure 8:
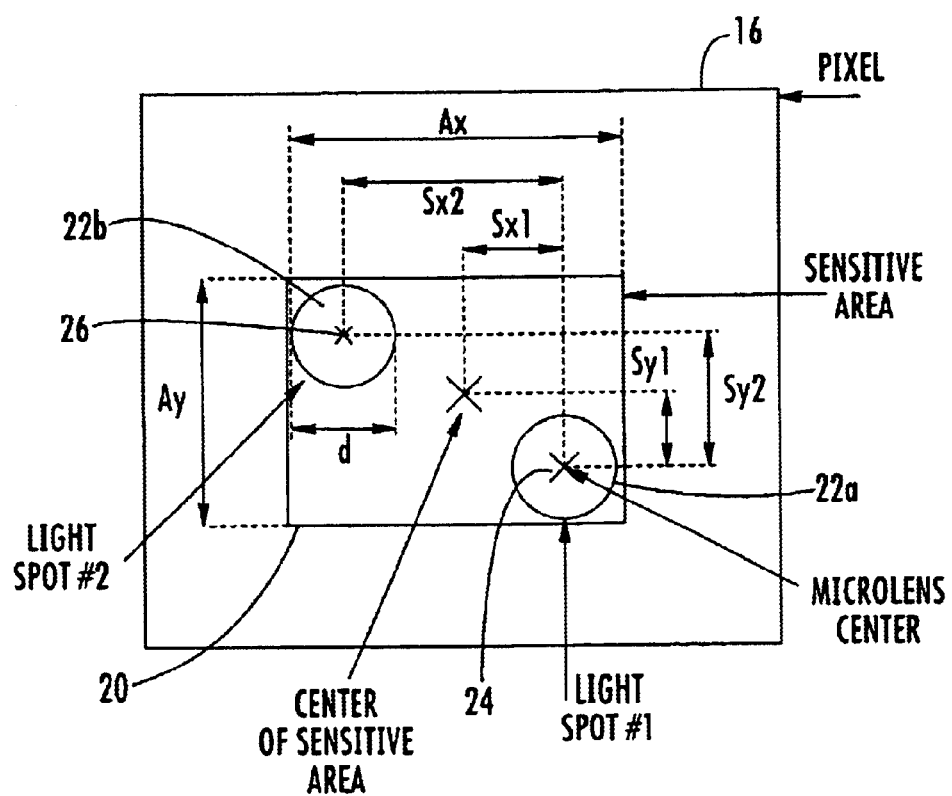

This concept is illustrated in FIG. 8, where two focussed light spots 22a and 22b, as might be produced using two different primary lenses having different focal lengths, are shown. Both of the light spots 22a and 22b are within the sensitive area 20 of the pixel 16. Accordingly, it can be seen that a microlens position optimised for a given primary focal length will also be acceptable for a range of primary focal lengths. By way of example, one of the primary lenses may be a telecentric lens (i.e., $f_B = \infty$), and the other may have a shorter focal length $f_B = f_{B2}$. When the telecentric lens is used, light is perpendicular to the image plane, so the focussed light spot is directly beneath the center of the lens (i.e., the shift s from equation (1) is equal to zero).

If the microlens center 24 is positioned above the center of the light spot 22a at the most extreme acceptable position towards the central axis of the sensor (i.e., the lower right of the pixel sensitive area in this example where we are considering the top left pixel of the sensor array), then light from a telecentric lens will be focussed at that position and the focussed light spot for any shorter focal length will be shifted upwards and to the left. The shortest acceptable focal length will be that which produces the focussed light spot 22b at position 26, and can be calculated according to the following equations:

$$s_{x1} = A_x/2 - d/2, \text{ and} \tag{2.1}$$

$$s_{y1} = A_y/2 - d/2, \tag{2.2}$$

where $s_{x1}$ and $s_{y1}$ are the required shifts in the x and y directions from the center of the sensitive area 20 to the position 24, $A_x$ is the width of the sensitive area 20, $A_y$ is the height of the sensitive area 20, and d is the diameter of the focussed light spot. By symmetry:

$$s_{x2} = A_x - d, \tag{3.1}$$

and $$s_{y2} = A_y - d, \tag{3.2}$$

where $s_{x2}$ and $s_{y2}$ are the x and y shifts from position 24 to position 26. From equation (1), it follows that:

$$s_{x2}=D_x \times t/(2 \times f_{B2x} \times n), \quad (4.1)$$

and $$s_{y2}=D_y \times t/(2 \times f_{B2y} \times n), \quad (4.2)$$

Furthermore, from equations (3) and (4) it follows that:

$$f_{B2x}=D_x \times t/(2 \times (A_x-d) \times n), \quad (5.1)$$

and $$f_{B2y}=D_y \times t/(2 \times (A_y-d) \times n). \quad (5.2)$$

Thus, with respect to the x-axis, the sensor can be used with lenses with a range of back focal length between ∞ and $f_{B2x}$ without any vignetting in the x-axis. The range in the y-axis will be determined by $f_{B2y}$. Since a lens has only one focal length, the range will be limited by whichever axis vignettes first. Preferably, $f_{B2x}=f_{B2y}$, thus:

$$D_x \times t/(2 \times (A_x-d) \times n) = D_y \times t/(2 \times (A_y-d) \times n),$$

which can be simplified to:

$$D_x/A_x=D_y/A_y, \quad (6)$$

and rearranged to:

$$A_x/A_y=D_x/D_y \quad (7)$$

From this analysis it follows that, for operation over a maximal range of lens focal lengths, the aspect ratio of the pixel's light sensitive area should be substantially equal to the aspect ratio of the image array as a whole. For example, if the image array has a 16:9 aspect ratio, the sensitive area of the pixel should also have a 16:9 aspect ratio to maximize the range of lenses that will operate with the microlenses and not cause vignetting.

As can be seen from equation (1), the shifts required to provide optimal placement of each microlens is proportional to the distance of each pixel from the center of the image sensor (i.e., from the optical axis of the primary lens system), requiring a smooth, continuous shift of the center positions of the microlenses as disclosed in U.S. Pat. No. 5,610,390. Typically, the difference in shift between neighboring pixels would be on the order of 10 nm–15 nm. This is difficult if not impossible to achieve in practice since the maximum design resolution (i.e., the minimum snap-grid delta) for semiconductor masks used in the manufacture of image sensors and microlens arrays is on the order of 50 nm–100 nm.

In accordance with the present invention, the microlens array is divided into blocks, each including a plurality of microlenses, and variations in the parameters of the microlens array are applied to blocks of microlenses rather than to individual microlenses. This allows shifting of the microlenses to be accomplished without any modification of standard design or manufacturing technologies. The invention can be applied at the design stage, with no need to modify manufacturing processes, and is therefore relatively easily implemented for high volume production.

For practical purposes, the minimum displacement which can be applied to a block of microlenses is equal to the minimum snap-grid delta determined by the process technology, as mentioned above (typically 50–100 nm). This dimension is referred to hereinafter simply as Delta and is smaller than the pixel size or feature size. The frequency of the displacement (i.e., the block size) may be selected such that the cumulative effect of the displacements produce the required shift of the microlenses. This approach may be implemented in two basic ways, namely by varying the gap between adjacent blocks of microlenses, as illustrated in FIG. 9, and by varying the sizes of microlenses at selected edges of blocks, as illustrated in FIG. 10.

Figure 9:
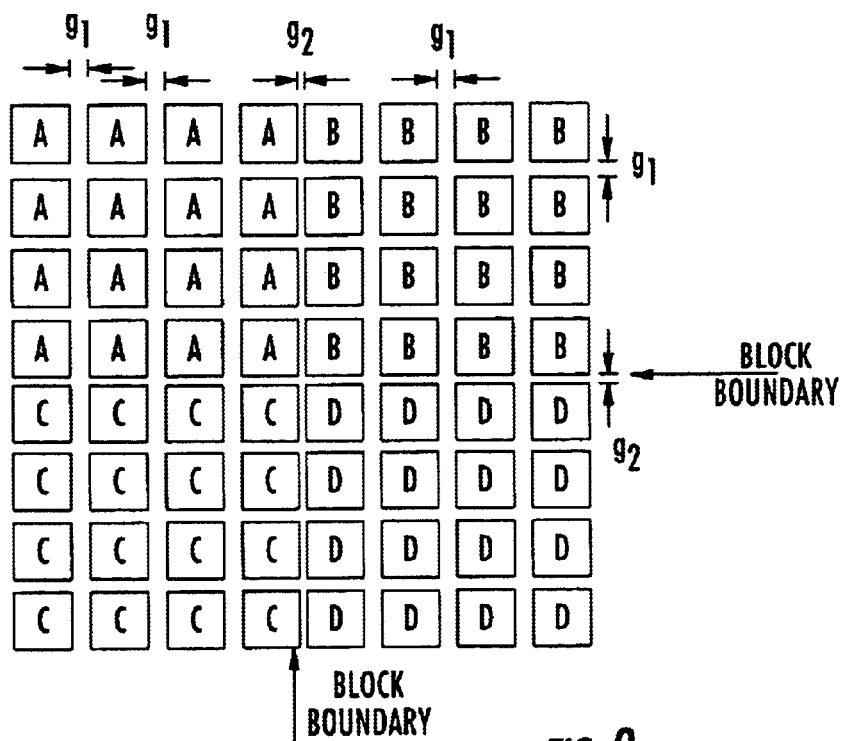
FIG. 9 is a schematic block diagram illustrating a first embodiment of part of a microlens array in accordance with the present invention.

Referring initially to FIG. 9, an array of microlenses is illustrated which is divided into four blocks. The lenses belonging to each of the four blocks are identified as A, B, C, and D. The spacing between each microlens within each block is g1, which is greater than Delta. The spacing at the boundaries between each adjacent block is g2, where g2 is less than g1. If the optical axis of the array is at the intersection of blocks A, B, C and D, it will be seen that the effect of the reduced gaps g2 is to shift the optical axis of each of the individual microlenses within each block towards the optical axis of the array. If this shift is repeated for additional blocks surrounding the central blocks A, B, C, and D, it will be seen that the cumulative shift will increase for blocks at increasing distances from the optical axis of the array.

The advantage of this implementation, in which the gap g2 between adjacent blocks is narrowed compared with the gap g1 between individual microlenses within a block, is that the microlenses are of constant size. This provides constant optical performance and makes the block boundaries less visible. The disadvantage is that the minimum size of g2 is determined by the process technology, so g1 will likely be greater than the minimum possible gap (the minimum possible gap size g1=g2+Delta), reducing the "fill factor" of the microlenses and thus degrading sensor performance by reducing sensitivity.

Figure 10:
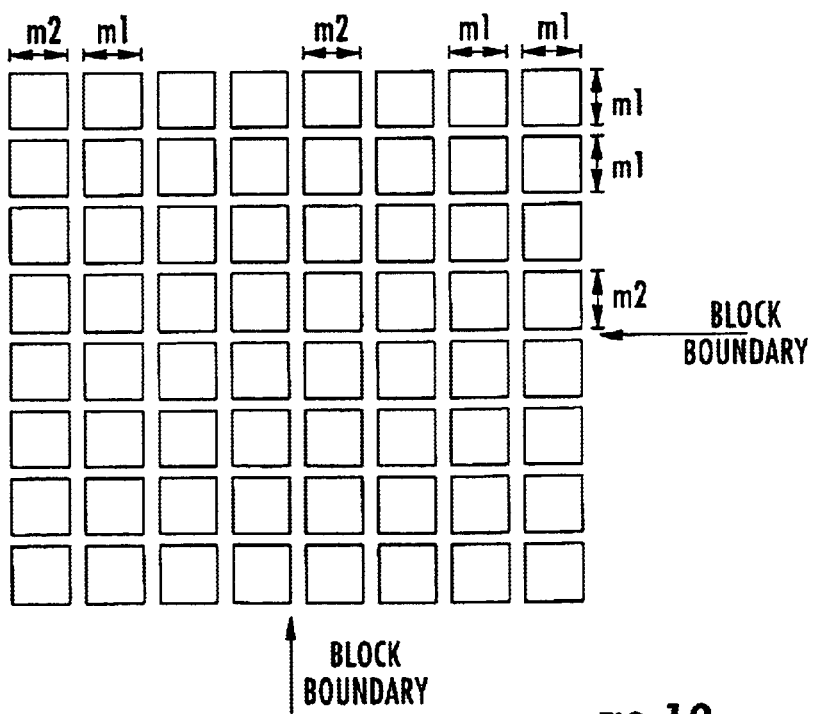
FIG. 10 is a schematic block diagram illustrating a second embodiment of part of a microlens array in accordance with the present invention.

Referring now to FIG. 10, the alternative is for the gaps between individual microlenses and blocks of microlenses to be kept constant (usually at the minimum possible value), and to reduce the sizes of those microlenses at the block boundaries so that the blocks as a whole are effectively shifted in a manner similar to those of FIG. 9. As shown in FIG. 10, "normal" microlenses have a size m1×m1, while the reduced size microlenses have a size m2×m1 or m2×m2. The minimum difference between m1 and m2 is again determined by the design/process Delta value m1=m2+Delta.

The advantage of this implementation is that the gap size between all microlenses may be maintained at a minimum, maximizing the fill factor and sensitivity. The disadvantage is the reduced size of the microlenses at the block boundaries, which may reduce the sensitivity of the corresponding pixels and possibly give rise to visible patterning in the sensor output. Such patterning can be removed by calibrating the sensor using a white image and scaling the pixel outputs appropriately, or by disguising the edges in a manner to be described below.

In each case, the value of Delta is determined by the design system and/or process technology in use. The total microlens shift required at the corners of the sensor can be calculated as described above. It then remains to determine the size of the block (number of pixels) which will provide the required shift at the corners, which can be calculated (for each axis x and y) as follows:

$$\text{Block Size} = \text{INT}(\text{Delta} \times N\text{Pix}/(2 \times s)), \quad (8)$$

where the block size is the number of rows/columns of pixels in a block, Delta is the change in size (of gap or microlens), Npix is the number of rows/columns of pixels in the array, and s is the microlens shift required at corners of the array. The INT (integer) function is used so that only a whole number of pixels will be shifted. For a typical image sensor array, the block size is likely to be in the range of about 4 to 10 rows/columns.

In both of the cases illustrated in FIGS. 9 and 10, the cumulative effect of the block shifts is to shift individual microlenses so that substantially all of the light collected by each microlens is focussed within the sensitive area of the associated pixel. However, both arrangements create discontinuities in the spatial sensitivity response of the sensor array due to changes in the effective fill factor of the microlenses at the boundaries of the blocks.

A high performance digital still camera would typically go through a calibration stage during manufacture in which the black level offset and gain of each pixel would be measured and stored in the camera to compensate for non-uniformities caused by manufacture of the image sensor. This technique would also substantially eliminate the effect of the sensitivity changes at the block boundaries of a microlens array in accordance with the present invention. However, this type of calibration adds significantly to the cost of the camera as it requires time and effort during manufacture and also requires the camera to include memory devices to store the correction parameters. Accordingly, this technique is too expensive to use in low cost imaging systems.

In accordance with a preferred feature of the invention, visible patterning arising from the discontinuities at the block boundaries may be disguised by the following methods, without adding to the cost of the sensor. As described above in relation to FIGS. 9 and 10, the microlens array is divided into regular rectangular blocks so that the boundaries are straight lines. This causes visible patterning in the sensor output which is particularly apparent and undesirable. The boundaries may be disguised and the resultant patterning made less apparent by modifying the shapes of the blocks so that their boundaries are irregular.

Figure 11:
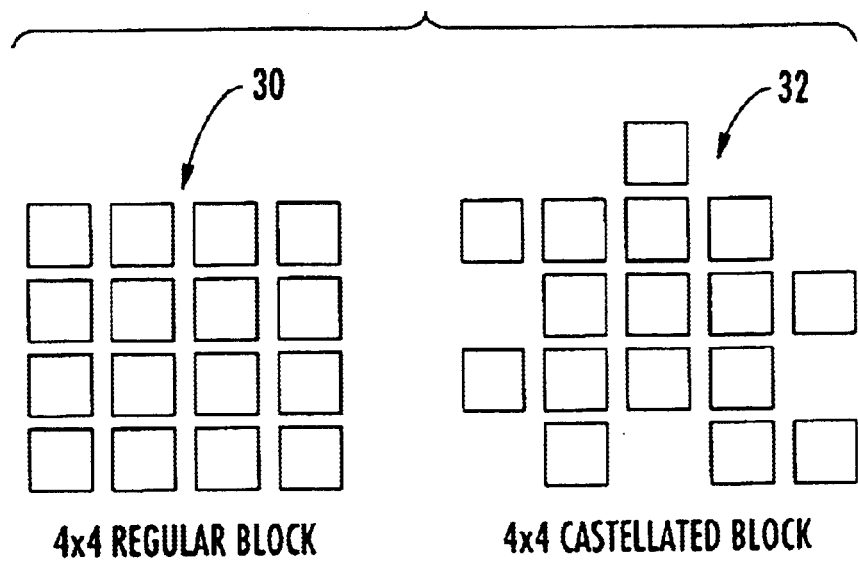
FIG. 11 is a schematic block diagram illustrating the difference between a rectangular block of microlenses and a castellated block of microlenses as used in embodiments of the present invention.

An example of this idea as applied to a 4×4 block of microlenses is illustrated in FIG. 11. It should be noted that while a 4×4 block is illustratively shown, the technique is applicable to blocks of any size. A regular, rectangular block 30 is shown, alongside a modified block 32 in which individual microlenses have effectively been displaced so that the edges of the block are "castellated." The total number of microlenses in the block remains the same, and a plurality of such modified blocks can be tessellated to form a continuous, uniform array. This technique can be applied both in the case where block shifts are effected by narrowing the gaps between blocks (FIG. 12) and in the case where block shifts are effected by reducing the size of microlenses at the block boundaries (FIG. 13).

Figure 12:
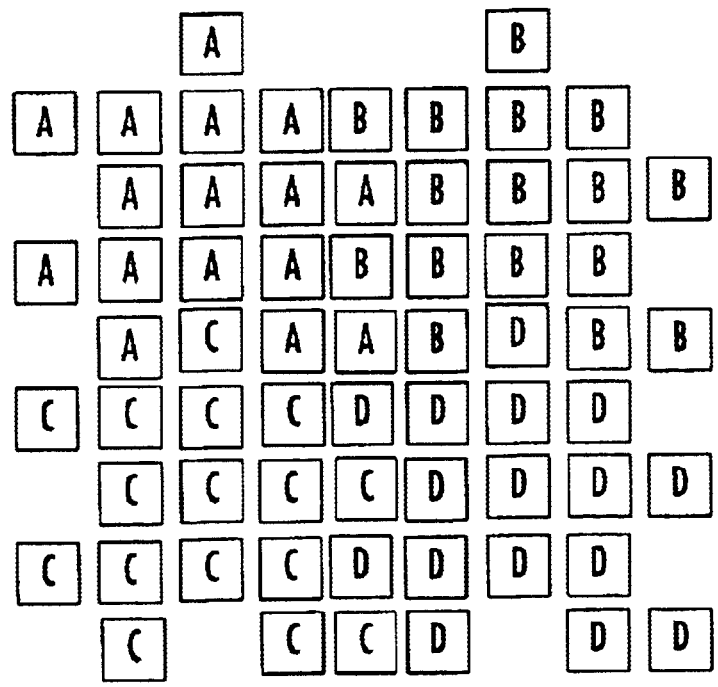
FIG. 12 is a schematic block diagram illustrating a third embodiment of part of a microlens array in accordance with the present invention including castellated blocks of microlenses.
Figure 13:
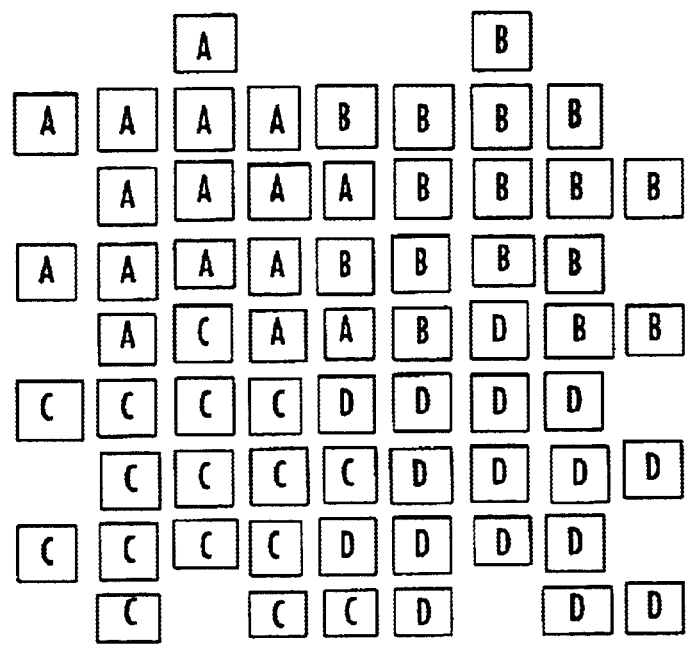
FIG. 13 is a schematic block diagram illustrating a fourth embodiment of part of a microlens array in accordance with the present invention including castellated blocks of microlenses.
Figure 14:
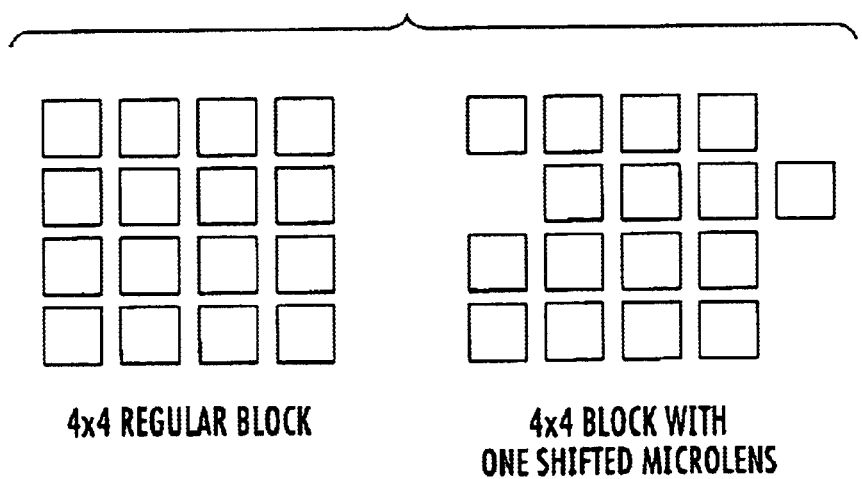
FIG. 14 is a schematic block diagram illustrating the difference between a rectangular block of microlenses and a modified block of microlenses as used in various embodiments of the present invention.

In FIGS. 12 and 13, the individual microlenses making up four blocks are again identified as A, B, C and D. It will be understood that the size and shape of irregular blocks making up an array may vary from the illustrated examples, as long as the blocks are capable of being tessellated, i.e., as long as they can fit together to form a substantially uniform, continuous array. Suitable designs of block shapes can easily be achieved by starting with a rectangular block and moving a block from one side to the other. This is illustrated in FIG. 14, which shows a rectangular block 34 and a corresponding block with one microlens moved. The same movement can be applied to microlenses on more than one side of the starting block, as illustrated by the example of FIG. 11.

The present invention also relates to solid state image sensors incorporating microlens arrays of the types described above, and into imaging systems and cameras including such sensors. Furthermore, it will be appreciated that other improvements and modifications may be incorporated without departing from the scope of the invention.

That which is claimed is:

1. A solid state image sensor comprising:
    an array of pixels and a corresponding array of microlenses disposed adjacent said array of pixels, positions of said microlenses relative to corresponding pixels varying based upon distances of said corresponding pixels from a central optical axis of the solid state image sensor to substantially eliminate vignetting of light collected by said microlenses;
    said array of microlenses being divided into blocks each comprising a plurality of said microlenses, and within at least one of said blocks the positions of said microlenses relative to said corresponding pixels thereof being varied by an equal amount.

2. The solid state image sensor of claim 1 wherein said microlenses within each of said blocks are substantially equally spaced apart from one another a first distance, and wherein adjacent blocks of microlenses are spaced apart from one another a second distance less than the first distance.

3. The solid state image sensor of claim 1 wherein said microlenses are substantially equally spaced from one another throughout said array of microlenses, and wherein a plurality of microlenses in each of said blocks at edges thereof are smaller in at least one dimension than said remaining microlenses in each of said blocks.

4. The solid state image sensor of claim 1 wherein said blocks are substantially rectangular.

5. The solid state image sensor of claim 1 wherein said blocks have irregular edges, and wherein said blocks are tessellated to form a substantially continuous array of microlenses.

6. An imaging system comprising:
    a solid state image sensor comprising
    an array of pixels and a corresponding array of microlenses disposed adjacent said array of pixels, positions of said microlenses relative to corresponding pixels varying based upon distances of said corresponding pixels from a central optical axis of said solid state image sensor to substantially eliminate vignetting of light collected by said microlenses,
    said array of microlenses being divided into blocks each comprising a plurality of said microlenses, and within at least one of said blocks the positions of said microlenses relative to said corresponding pixels thereof being varied by an equal amount; and
    a display for cooperating with said solid state image sensor to display images therefrom.

7. The imaging system of claim 6 wherein said microlenses within each of said blocks are substantially equally spaced apart from one another a first distance, and wherein adjacent blocks of microlenses are spaced apart from one another a second distance less than the first distance.

8. The imaging system of claim 6 wherein said microlenses are substantially equally spaced from one another throughout said array of microlenses, and wherein a plurality of microlenses in each of said blocks at edges thereof are smaller in at least one dimension than said remaining microlenses in each of said blocks.

9. The imaging system of claim 6 wherein said blocks are substantially rectangular.

10. The imaging system of claim 6 wherein said block have irregular edges, and wherein said blocks are tessellated to form a substantially continuous array of microlenses.

11. A camera comprising:

a housing; and a solid state image sensor carried by said housing and comprising an array of pixels and a corresponding array of microlenses disposed adjacent said array of pixels, positions of said microlenses relative to corresponding pixels varying based upon distances of said corresponding pixels from a central optical axis of said solid state image sensor to substantially eliminate vignetting of light collected by said microlenses, said array of microlenses being divided into blocks each comprising a plurality of said microlenses, and within at least one of said blocks the positions of said microlenses relative to said corresponding pixels thereof being varied by an equal amount.

12. The camera of claim 11 wherein said microlenses within each of said blocks are substantially equally spaced apart from one another a first distance, and wherein adjacent blocks of microlenses are spaced apart from one another a second distance less than the first distance.

13. The camera of claim 11 wherein said microlenses are substantially equally spaced from one another throughout said array of microlenses, and wherein a plurality of microlenses in each of said blocks at edges thereof are smaller in at least one dimension than said remaining microlenses in each of said blocks.

14. The camera of claim 11 wherein said blocks are substantially rectangular.

15. The camera of claim 11 wherein said blocks have irregular edges, and wherein said blocks are tessellated to form a substantially continuous array of microlenses.

16. A method for substantially eliminating vignetting of light collected by microlenses disposed adjacent an array of pixels in a solid state image sensor, the method comprising:

varying positions of the microlenses relative to corresponding pixels based upon distances of the corresponding pixels from a central optical axis of the solid state image sensor;

dividing the microlenses into a plurality of blocks of microlenses; and varying positions of a plurality of microlenses within at least one of the blocks of microlenses relative to corresponding pixels thereof by an equal amount.

17. The method of claim 16 wherein the microlenses within each of the blocks are substantially equally spaced apart from one another a first distance, and wherein adjacent blocks of microlenses are spaced apart from one another a second distance less than the first distance.

18. The method of claim 16 wherein the microlenses are substantially equally spaced from one another throughout the array of microlenses, and wherein a plurality of microlenses in each of the blocks at edges thereof are smaller in at least one dimension than the remaining microlenses in each of the blocks.

* * * * *